United States Patent [19]

Subramanian

[11] 4,166,257
[45] Aug. 28, 1979

[54] CAPACITIVELY WEIGHTED SURFACE ACOUSTIC WAVE DEVICE

[75] Inventor: Sundaram Subramanian, Anaheim, Calif.

[73] Assignee: Motorola, Inc., Schaumburg, Ill.

[21] Appl. No.: 843,474

[22] Filed: Oct. 19, 1977

[51] Int. Cl.² ............... H03H 9/04; H03H 9/26; H03H 9/30; H01L 41/10
[52] U.S. Cl. ............................... 333/151; 310/313; 333/154; 333/194; 333/196
[58] Field of Search .................. 333/30 R, 71, 72; 310/313; 331/107 A

[56] References Cited

U.S. PATENT DOCUMENTS

| | | | |
|---|---|---|---|
| 3,748,603 | 7/1973 | Wojcik | 333/72 |
| 3,894,251 | 7/1975 | Shibayama et al. | 333/30 R X |
| 3,904,996 | 9/1975 | Rosenfeld | 333/72 |
| 4,035,675 | 7/1977 | Malocha et al. | 333/30 R X |

Primary Examiner—Alfred E. Smith
Assistant Examiner—Marvin Nussbaum
Attorney, Agent, or Firm—James W. Gillman; Victor Myer

[57] ABSTRACT

A surface acoustic wave device wherein the interdigitated fingers are capacitively weighted with decreasing capacitance from the center of the transducer to the ends thereof has an improved response in the frequency passband in that the dip therein is substantially diminished, if not eliminated, when the interdigitated fingers of the transducer are of the split-connected form except adjacent at the ends of the transducer where the interdigitated fingers are of the split-isolated form, or all of the interdigitated fingers are of the split-isolated form. The increased surface acoustic wave reflection occurring at the end fingers where the weighting capacitors are small is overcome by the decreased surface acoustic wave reflection resulting from the increased impedance of the split-isolated fingers.

5 Claims, 5 Drawing Figures

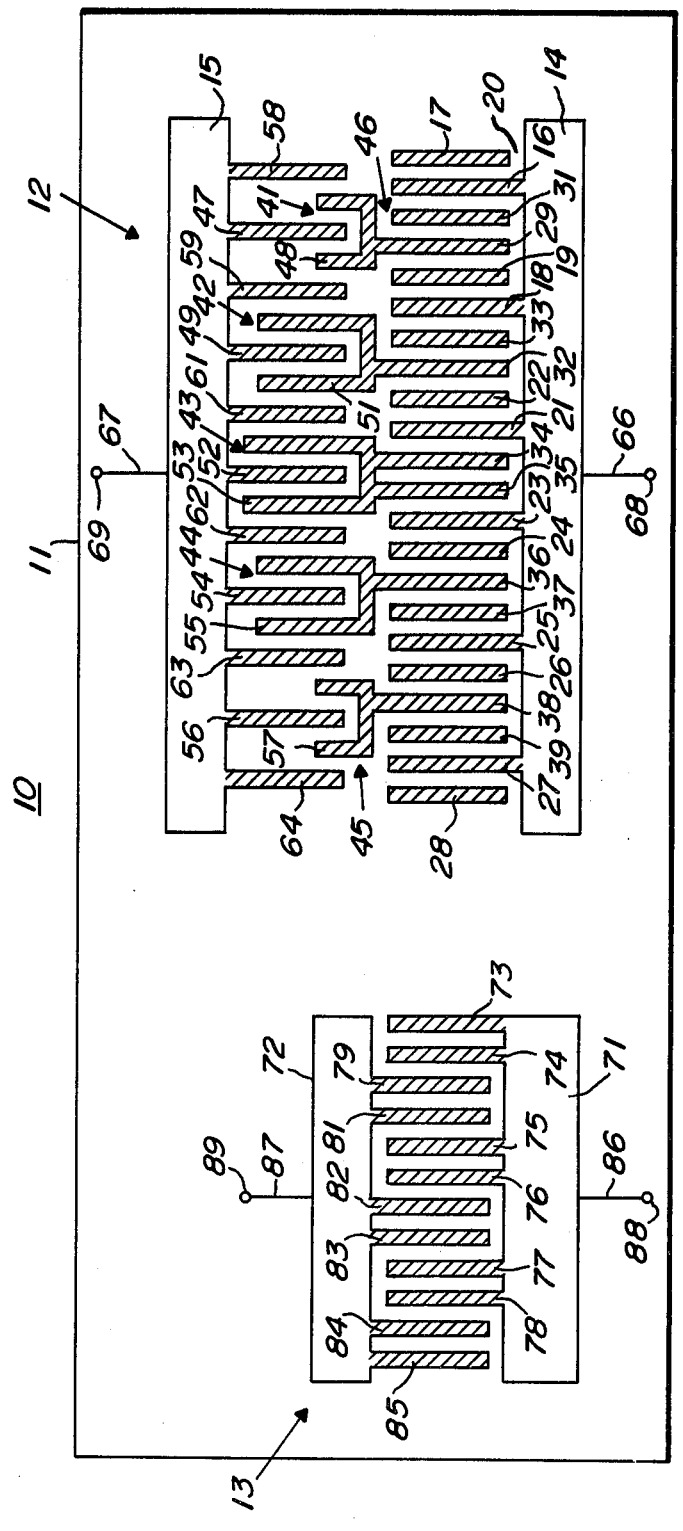
Fig. 1
Fig. 3
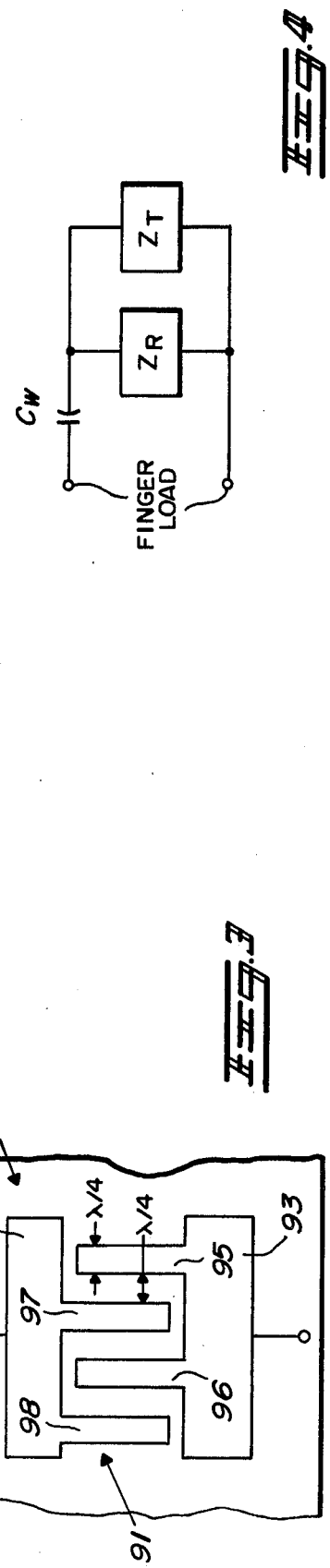
Fig. 4

CAPACITIVELY WEIGHTED SURFACE ACOUSTIC WAVE DEVICE

BACKGROUND OF THE INVENTION

This invention relates to capacitively weighted surface acoustic wave devices or transducers, and more particularly to means for improving the frequency response characteristics of such devices in order to minimize, if not eliminate, dips in the response characteristic within the frequency pass band to which prior devices have been subject.

Surface acoustic wave devices usually comprise a piezoelectric substrate upon which two or more series of interdigitated fingers or electrodes, called transducers, are deposited. Typical materials for the substrate are quartz and lithium niobate. The interdigitated fingers frequently are made of aluminum and are deposited and formed by well-known semiconductor techniques.

Surface acoustic wave devices, commonly called SAWS, are finding increasing uses as filters, delay lines and the like in the frequency ranges of 10 MegaHertz to 1 GigaHertz or higher.

Capacitive weighting of the individual fingers is one form of achieving the desired frequency response characteristics of a surface acoustic wave device or transducer, particularly when used as a filter. The U.S. Pat. to Ronald C. Rosenfeld, No. 3,904,996 entitled "Capacitive Weighted Acoustic Surface Wave Filter" teaches this form of device. The interdigitated electrodes or fingers extend from transducer pads on each side of the device and a capacitor formed by the same semiconductor techniques, as for example by vacuum deposition, photolithographic techniques and chemical etching is associated with each one of the interdigitated fingers.

To achieve the desired form of frequency pass band, which is usually to achieve maximum rejection of the frequencies beyond the desired band and a rapid skirt roll-off from the flat portion of the response pattern to the sides or skirts thereof, in a capacitively weighted transducer, it is required that the weighting capacitors of the electrodes towards the ends of the transducer be much smaller in value than the electrode capacitance, i.e., the capacitance of the electrode fingers. However, it is known that the electrodes of a surface acoustic wave device where the weighting capacitance is much smaller than the capacitance of the electrode fingers reflect more acoustic surface wave energy than the finger electrodes where the weighting capacitance is approximately equal to the capacitance of the electrode fingers. Reference is made to Ecom report 72-0326-5 October, 1974 entitled "Subminiature Broad Band Filters" pages 31–46 by Rosenfeld et al (U.S. Army Electronics Command). The reflection from the outer electrodes or fingers of the transducer causes a dip in the frequency pass band as pointed out in the Ecom report referred to. This dip due to the reflection from the capacitively weighted outer electrodes has been associated with quarter wavelength or split-connected electrodes. Reference is made to the Ecom report above and Publication DeVries, et al "Reflection of a Surface Wave From Three Types of ID Transducers", 1972 Ultrasonics Symposium Proceedings, pp. 353–358.

SUMMARY OF THE INVENTION

It is an object of the invention to provide an improved capacitively weighted surface acoustic wave device wherein the dip in the frequency passband of prior devices of this nature is substantially minimized, if not eliminated.

In certain of the prior art surface acoustic wave devices the interdigitated fingers were of the so-called split-connected variety in which each finger was ⅛ of a wavelength in width and separated from its nearest adjacent finger by a space also ⅛ of a wavelength in width. In these devices the reflected acoustic energy has been shown to be proportional to the electric load impedance on the electrodes. In this connection reference is made to the DeVries Publication above. For split-connected electrodes, the higher the load impedance, the greater the fraction of acoustic energy is reflected by the interdigitated electrodes. The load impedance at an individual electrode consists of the weighting capacitor of that electrode in series with the load impedance connected to the transducer terminals and the impedance of the remaining sections of the transducer. Thus, as will subsequently be more fully explained, the electrical load impedance at an individual electrode is large if its weighting capacitor is small. Consequently, more acoustical energy is reflected from the electrodes where the weighting capacitor is small than from the electrodes where the weighting capacitors are larger. It is known that surface wave transducers having the split-isolated electrode configuration reflect less acoustic energy the higher the load impedance. See DeVries et al "Reflections of a Surface Wave from Three Types of ID Transducers" referred to above. This is the inverse of the electrode configurations of the split-connected variety in which higher impedance causes greater reflections.

According to one form of the invention, there is provided an improved surface acoustic wave device comprising a piezoelectric substrate, a series of split-isolated interdigitated electrodes disposed on the surface of the substrate, and a capacitive weighting electrode means on the substrate associated with the split-isolated interdigitated electrodes. According to a further form of the invention, the capacitance of the capacitive weighting electrodes decreases from the center of the series of interdigitated electrodes toward the ends thereof.

According to a still further form of the invention, a piezoelectric substrate, a series of interdigitated electrodes disposed on the surface of the substrate, capacitive weighting electrode means on the substrate associated with the interdigitated electrodes, the capacitance of the capacitive weighting electrodes decreases from the center of the series of interdigitated electrodes toward the ends thereof, and the ones of the interdigitated electrodes adjacent to the ends of said series of interdigitated electrodes adjacent to the ends of said series of interdigitated electrodes comprising split-isolated electrodes.

DESCRIPTION OF THE DRAWINGS

FIG. 1 is a plan view of a surface acoustic wave device according to the invention;

FIG. 3 is a plan view of a prior art transducer useful in the explanation of the invention;

FIG. 4 is a circuit diagram useful in the explanation of the invention; and

DESCRIPTION OF THE PREFERRED EMBODIMENT

Figure 2:
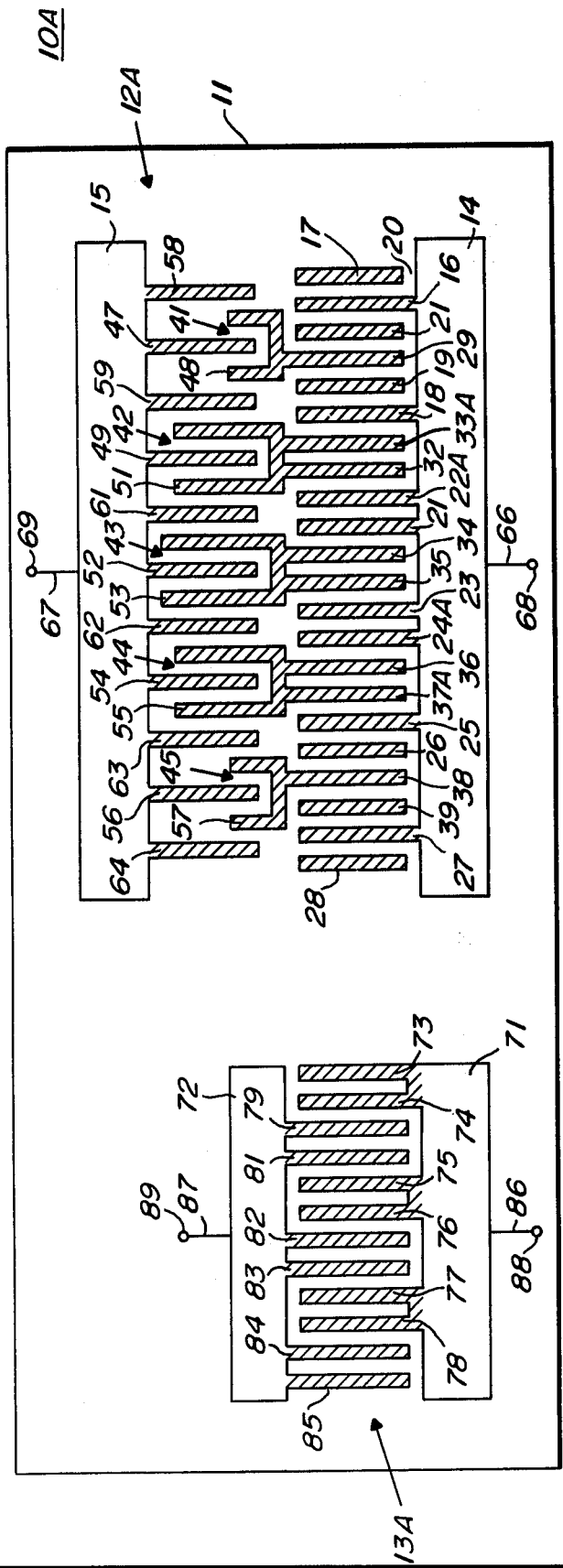
FIG. 2 is a similar plan view of a further form of device according to the invention.

Referring to FIG. 1 there is shown a surface acoustic wave device 10 comprising a substrate 11, a capacitively weighted transducer 12 and a transmitting, or receiving, transducer 13. The substrate 11 may be of any well-known piezoelectric material such, for example, as quartz or lithium niobate. The transducers 12 and 13 are thin metallic fingers of the configuration shown and are deposited on the surface of the substrate in any well-known manner such as by vacuum deposition or other semiconductor techniques. The material of the transducers 12 and 13 may be of any well-known material for the purpose such for example, as aluminum.

The transducer 12 comprises a pair of pads 14 and 15 from which extend the various conducting interdigitated fingers or electrodes. The fingers associated with each pad occur in pairs, as for example, the finger pairs 16 and 17, 18 and 19, 21 and 22, 23 and 24, 25 and 26 and 27 and 28 are associated with pads 14, the fingers 16, 18, 21, 23, 25, and 27 being actually connected to pad 14 while the fingers 17, 19, 22, 24, 26 and 28 are isolated therefrom by gaps as shown, for example gap 20 for finger 17. The finger pairs 29 and 31, 32 and 33, fingers 34 and 35, finger pairs 36 and 37 and 38 and 39 are associated with pad 15, the fingers 29, 32, 34, 35, 36, and 38 being actually connected to pad 15 through the respective capacitors 41, 42, 43, 44, and 45, as will be explained, and fingers 31, 33, 37, and 39 are isolated from pad 15, by the gaps as shown for example gap 46 in connection with finger 31.

The capacitor 41 is formed essentially by the finger 47 extending from pad 15 and into the gap formed with the U-shaped member 48 connected to finger 29. Similarly the capacitor 42 is formed by the finger 49 projecting into the U-shaped member 51 connected to finger 32, the capacitor 43 is formed by the finger 52 projecting into the gap formed with the U-shaped member 53 connected to fingers 34 and 35, the capacitor 44 is formed by the finger 54 projecting into the gap formed by U-shaped member 55 connected to finger 36 and the capacitor 45 is formed by the finger 56 projecting into the gap formed by U-shaped member 57 connected to finger 38. For purposes of symmetry of the electrode or finger structure the additional fingers 58, 59, 61, 62, 63, and 64 extend from the pad 15 as shown.

The transducer 12 shown and described is symmetrical with respect to the center finger 52 extending from the pad 15.

Each electrode 16 and 17 for example of the electrode pairs 16 and, 17 to 27 and 28 are ⅛ of a wavelength in width and are separated by a gap which is ⅛ of a wavelength in width. Each of the pairs of electrodes or fingers, for example, 16 and 17 together are conceived of as one electrode which is split by the gap between them and thus these electrodes or fingers are referred to as split-isolated because only the finger 16 is actually connected to the pad 14 whereas the finger 17 is separated from the pad 14 by a gap 20. Similarly, of the finger pairs 18 Consequently 19, 21 and 22, 23 and 24, 25 and 26, and 27 and 28, the fingers are split with simpler 18, 21, 23, 25, and 27 being connected to pad 14 while fingers 19, 22, 24, 26, and 28 are isolated therefrom by a gap. Each of these pairs of fingers is conceived of as a split finger with one-half thereof isolated from the pads and referred to in the art as split-isolated fingers.

The capacitor 43 has a larger capacitive value than the capacitor 42 by virtue of the larger overlap of the finger 52 with the fingers of the U-shaped member 53 than the corresponding overlap of the finger 49 with the fingers of the U-shaped member 51. The capacitor 42 is larger in capacitive value than the capacitor 41 by virtue of the larger overlap of the finger 49 with the fingers forming the U-shaped member 51 as compared with the overlap of the finger 47 with the fingers of the U-shaped member 48. Thus the capacitive value of capacitor 41 is the least and the capacitive value of capacitor 43 is the greatest in the structure as shown. Correspondingly on the left hand side of the transducer 12 the capacitor 44 is less in capacitive value than the capacitor 43 and the capacitor 45 is less in capacitive value than the capacitor 44. In other words, the capacitive values of the finger weighting capacitors decrease from the center of the transducers toward the ends. This weighting, decreased capacitive value towards the end of the transducer is necessary in order to give the maximum rejection of undesired frequencies and rapid skirt roll-off as illustrated in the response curve 65 of FIG. 5 as will be more fully explained.

During use, voltages of the desired frequency are applied to the pads 14 and 15 through the conductors 66 and 67, respectively, which may terminate in terminal pads 68 and 69, respectively, the latter being formed, for example, on the substrate itself as is well understood.

The transducer 13 which may be a test transducer for determining the response of the transducer 12 when the latter is excited, is of a broad band nature and formed on the substrate in a well-known manner as already described. The transducer 13 is of the split-connected finger variety and comprises pads 71 and 72 from which extend interdigitated split-connected fingers. Thus, the fingers 73 and 74 of one pair, the fingers 75 and 76 of a second pair and fingers 77 and 78 of a third pair are all connected to the pad 71. Similarly the fingers 79 and 81 of one pair, the fingers 82 and 83 of a second pair of the fingers 84 and 85 of a third pair are connected to pad 72 and are interdigitated respectively with the finger pairs 73 and 74, 75 and 76 and 77 and 78. Each of the fingers 73–78 and 79–85 are ⅛ of a wavelength in width and the gap in between each of the fingers with its next adjacent finger is also ⅛ of a wavelength. Since each of the fingers of the respective pairs are connected to their respective pads, and are separated by a gap, the transducer 13 is of the split-connected variety. For sensing the voltage and frequency as they appear on the fingers of transducer 13, conductors 86 and 87 extend respectively from the pad 71 and 72 and the terminals 88 and 89, respectively, are connected to the conductors 86 and 87. The connecting pads 88 and 89, as well as the conductors 86 and 87, may of course be formed directly on the substrate itself as is well understood.

Transducer 13 is shown with only three sets of fingers extending from each of the pads 71 and 72. This is by way of example only in order to have a broad frequency response when this transducer is used for testing the response of transducer 12 to which the used frequencies are applied.

For a fuller understanding of the invention there is shown a transducer 91 in FIG. 3 which is of the prior art variety. Thus the transducer 91 formed in well-known manner on the substrate 92 comprises pads 93 and 94. Fingers 95 and 96 extend from pad 93 and fingers 97 and 98 extend from pad 94, the fingers 95–98 being interdigitated with each other as shown. The fingers 95 and 96 are each ¼ of a wavelength (λ/4) in width as shown and the space between each of the fingers, for example, fingers 95 and 97 is shown as ¼ of a wavelength (λ/4). The length of the fingers 95-98 in the transducer 91 as well as the lengths of the fingers in the transducers 12 and 13 of FIG. 1 are chosen, as well-known in the art, to be several wavelengths in length in order to have the beam width desired of the surface waves which travel along the surface of the substrate when excited by the transducers thereon.

By way of comparison the transducers according to the invention have fingers which are ⅛ of a wavelength in width and a space in between one finger and the next is also ⅛ of a wavelength (λ/8).

Figure 5:
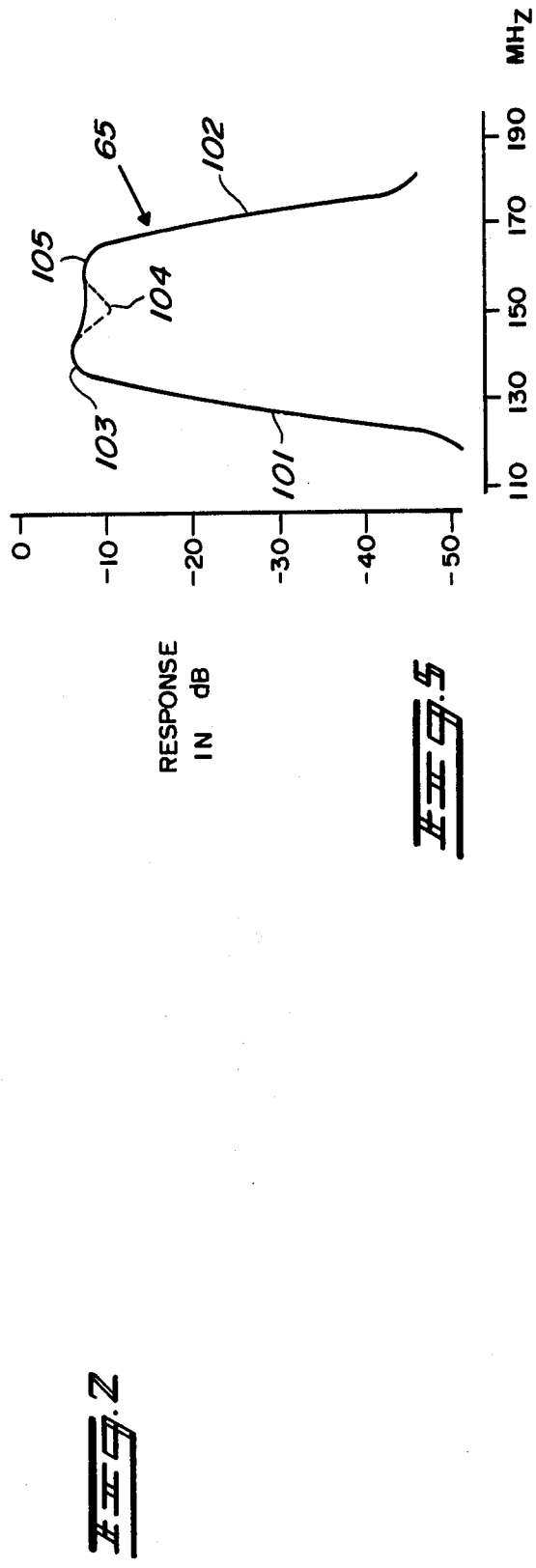
FIG. 5 is a graph showing the frequency response of a typical prior art device and a device according to the invention.

The frequency response of transducer 12, shown as curve 65 in FIG. 5, has maximum rejection of undesired frequencies and rapid skirt roll-off as shown by the relatively steep sides 101 and 102 and the rapid change from the top portion 103 to the steep sides 101 and 102. The response curve 65 is a plot of Decibels down from an arbitrary level of 0 against the frequency from 110 to 190 MHz, for example. Such a response curve can be made in typical fashion by applying to the transducer 12 at terminals 68 and 69 a frequency generator which sweeps through the band of frequencies indicated while measurements with a spectrum analyzer are made at terminals 88 and 89 of the test transducer and the results plotted by an automatic plotter. The maximum rejection (steep sides 101 and 102) and rapid skirt roll-off are achieved in the capacitively weighted transducer according to the invention by having the capacitors at the ends of the transducers, for example 41 and 45 much smaller in capacitive value as compared with the capacitors at the center of the transducer, for example capacitor 43.

It will of course, be understood that the number of interdigitated fingers and the transducer 12 of FIG. 1 is only exemplary and that in a typical case there would be many more interdigitated fingers and consequently many more capacitors associated therewith.

In cases according to the invention, the capacitance of the capacitors at the ends of the transducer have a much smaller capacity than the capacity existing between the fingers or electrodes themselves. It is known that in instances where the capacitive value of the weighting capacitor is much smaller than the capacitive value between the electrodes or fingers, more acoustic surface wave energy is reflected than where the capacitive value of the weighting capacitor is closer to and perhaps of the same order of magnitude as the capacitance value between the electrodes or fingers.

The reflections from the outer electrodes, in the capacitively weighted transducer, for example the electrodes 29 and 16 and 38 and 27 of the transducer 12, cause a dip 104 (FIG. 5) in the frequency passband. It may be theorized that because the outer fingers of the transducers reflect more surface wave energy than the center fingers in the transducer acts somewhat in the nature as a resonator, in any event having the dip in the passband as shown by 104. In this connection, reference is made to the publication Ecom Report 72-0326-F October 1974 Rosenfeld et al pp 31–46 referred to above. This is according to the prior art transducers of the quarter wavelength or split-connected finger form.

It is also known from the publication 1972 Ultrasonics Symposium Proceedings, pp. 353–358 referred to above that the reflected acoustic energy is proportional to the electric load impedance on the electrodes. For the split-connected finger case the higher the load impedance, the greater the fraction of acoustic energy reflected by the electrode. As shown in FIG. 4, the load seen by any finger consists of the weighting capacitance for that finger $C_w$ in series with the load impedance connected to the transducer terminal ($Z_R$) and the impedance of the remaining sections of the transducer ($Z_T$). This is to say that if an observer were standing in a particular finger and were observing the impedance at that point the impedances shown in FIG. 4 would be what he would see. It will be evident that since the weighting capacitance $C_w$ is in series with the impedance of the transducer and of the load, the impedance of the weighting capacitor is the principal element and when this impedance is high as when the weighting capacitance is small the load seen by the finger is great and a greater fraction of acoustic energy is reflected by that electrode, giving the dip 104 in the response referred to.

Split-isolated electrodes as shown in FIG. 1 reflect less acoustical energy the higher the load impedance. This is the inverse of the split-connected electrodes. Thus the combination of the small weighting capacitors 41 and 45, for example, with the split-isolated fingers 29, 31 and 38, 39 results in a decreased amount of reflection because the split-isolated fingers reflect less acoustic energy than the split-connected. Accordingly, the dip in the response curve is substantially decreased by perhaps a factor of two or more and is shown as the dip 105 in FIG. 5.

In FIG. 1 all of the interdigitated fingers are of the split-isolated variety rather than just the ones at the ends of the transducer because the electrodes at the center of the transducer already reflect less acoustic surface wave energy due to the increased size of the weighting capacitors. Thus the reflections here may be of the same order of magnitude as the reflections from the outer electrodes as occasioned by the combination of the reduced weighting capacitors and the split-isolated fingers. Now because the fingers near the center of the transducer reflect about the same amount of acoustical energy as the outer electrodes, the resonance condition previously referred to does not occur. Consequently, there is a decreased dip 105 in the response curve, if not a complete elimination. Moreover, it is a simple matter to construct a transducer where in all the fingers are of one variety such as split-isolated for example rather than having combined forms of fingers.

In FIG. 2 the surface acoustic wave device 10A is of the form wherein combined types of fingers are used. To the extent that the devices of FIGS. 2 and 1 are the same, the same references characters are used. The transducer 13 of FIG. 2 is identical to that of FIG. 1 and the transducer 12A of FIG. 2 differs from 12 of FIG. 1 in that certain of the fingers to be identified are of the split-connected form as compared with the split-isolated form shown in FIG. 1. The capacitive weighting of the fingers associated with pad 15 are the same as those of FIG. 1.

The structural difference between the surface acoustic wave device 10A and 10 are as follows: finger 33A associated with finger 32 of device 10A is connected to the U-shaped member 51 whereas in device 10 the finger 33 is isolated from the U-shaped member 51, finger 22A associated with finger 21 of device 10A is connected to pad 14 whereas finger 22 of device 10 is isolated from pad 14, finger 24A associated with finger 23 of device 10A is connected to pad 14 whereas finger 24 of device 10 is isolated from pad 14, finger 37A associated with finger 36 in device 10A is connected to the U-shaped member 55 whereas in device 10 the finger 37 is isolated from the U-shaped member 55. Thus the fingers 32 and 33A, fingers 21 and 22A, fingers 23 and 24A, and fingers 36 and 37A of device 10A are split-connected whereas the corresponding fingers 32 and 33, fingers 21 and 22, fingers 23 and 24, and fingers 36 and 37 of the device 10 are of the split-isolated form.

In net effect, the interdigitated fingers of the device 10A in FIG. 2 adjacent the center and extending upwardly therefrom are of the split-connected form and only the interdigitated fingers adjacent the ends of the device are of the split-isolated form. The combination of the split-isolated fingers at the ends of the device and the reduced size of the weighting capacitors for example capacitors 41 and 45, result in a response curve wherein the dip in the passband is reduced as compared with conventional all finger split-connected structures. Thus the response curve 105 having a diminished dip as shown in FIG. 5 would apply to the form of device 10A of FIG. 2.

What is claimed is:
1. A surface acoustic wave device comprising,
   a piezoelectric substrate,
   a series of split-isolated interdigitated electrodes disposed on the surface of said substrate, and
   a series of capacitive weighting electrode means on said substrate, individual ones of said series of capacitive weighting electrode means being connected to individual ones of said series of said split-isolated interdigitated electrodes, the capacitance of said capacitive weighting electrode means decreases from the center of said interdigitated electrodes toward the ends thereof.

2. The surface acoustic wave device according to claim 1 including a further series of interdigitated electrodes disposed on the surface of said substrate in surface acoustic wave association with said series of split-isolated interdigitated electrodes.

3. The surface acoustic wave device comprising:
   a piezoelectric substrate,
   a series of interdigitated electrodes disposed on the surface of said substrate,
   a series of capacitive weighting electrode means on said substrate, individual ones of said series of capacitive weighting electrode means being connected to individual ones of said series of said interdigitated electrodes,
   the capacitance of said capacitive weighting electrodes decreases from the center of said interdigitated electrodes toward the ends thereof, and
   the ones of said interdigitated electrodes adjacent the ends of said series of interdigitated electrodes comprising split-isolated electrodes.

4. The surface acoustic wave device according to claim 3 wherein the ones of said series of said interdigitated electrodes between said electrodes adjacent the ends of said series being split-connected electrodes.

5. The surface acoustic wave device according to claim 3 including a further series of interdigitated electrodes disposed on the surface of said substrate and surface acoustic wave association with said series of interdigitated electrodes.

* * * * *